United States Patent
Ahn et al.

(10) Patent No.: US 9,379,725 B2
(45) Date of Patent: Jun. 28, 2016

(54) DIGITAL TO ANALOG CONVERTER

(71) Applicant: SK hynix Inc., Icheon-si, Gyeonggi-do (KR)

(72) Inventors: Chang Yong Ahn, Icheon-si (KR); Jun Ho Cheon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/599,608

(22) Filed: Jan. 19, 2015

(65) Prior Publication Data
US 2016/0105192 A1    Apr. 14, 2016

(30) Foreign Application Priority Data

Oct. 8, 2014 (KR) .......... 10-2014-0136005

(51) Int. Cl.
*H03M 1/66* (2006.01)
*H03M 1/00* (2006.01)
*H03M 1/70* (2006.01)
*H03M 1/74* (2006.01)

(52) U.S. Cl.
CPC ............ *H03M 1/002* (2013.01); *H03M 1/70* (2013.01); *H03M 1/00* (2013.01); *H03M 1/747* (2013.01)

(58) Field of Classification Search
CPC ........................... H03M 1/747; H03M 1/00
USPC .......................................... 341/144, 145, 162
See application file for complete search history.

(56) References Cited

U.S. PATENT DOCUMENTS 5,706,006 A * 1/1998 Hattori .............. H03M 1/002
341/144

FOREIGN PATENT DOCUMENTS

KR    1020070112373 A    11/2007
KR    1020130072842 A    7/2013

* cited by examiner

*Primary Examiner* — Joseph Lauture
(74) *Attorney, Agent, or Firm* — William Park & Associates Ltd.

(57) ABSTRACT

A digital to analog converter may include a reference voltage generation unit that generates a reference voltage and a plurality of unit conversion units connected through an output node. The plurality of unit conversion units may set a voltage level of the output node in response to digital codes and the reference voltage.

20 Claims, 3 Drawing Sheets

DIGITAL TO ANALOG CONVERTER

CROSS-REFERENCES TO RELATED APPLICATION

The present application claims priority under 35 U.S.C. §119(a) to Korean application number 10-2014-0136005, filed on Oct. 8, 2014, in the Korean Intellectual Property Office, which is incorporated herein by reference in its entirety as set forth in full.

BACKGROUND

1. Technical Field

Various embodiments relate to a semiconductor integrated circuit, and more particularly, to a digital to analog converter.

2. Related Art

A digital to analog converter receives a digital code and generates an output signal having a voltage level or a current amount corresponding to a code value of the digital code. That is, the digital to analog converter is configured to convert a digital signal to an analog signal.

As a semiconductor integrated circuit is fabricated in a small size and consumes low power, a digital to analog converter is also designed to be fabricated in a small size and to consume low power.

In a digital to analog converter designed to be fabricated in a small size and to consume low power, a coupling phenomenon may occur among signal lines due to a switch that repeats turn-on and turn-off according to a change in a code value of an inputted digital code, resulting in an abnormal operation of the digital to analog converter.

SUMMARY

In an embodiment of the invention, a digital to analog converter may include a reference voltage generation unit that may generate a reference voltage, and a plurality of unit conversion units. Further, each one of the plurality of unit conversion units may be activated or deactivated in response to a digital code. The unit conversion unit that is activated may drive a control node to a voltage level corresponding to a voltage level of the reference voltage, and the unit conversion unit that is deactivated may substantially maintain the control node to a voltage level greater than a voltage level of a ground voltage.

In another embodiment of the invention, a digital to analog converter may include a plurality of unit conversion units and an output node. Each one of the plurality of unit conversion units may be electrically coupled to the output node in response to a digital code, and each of the plurality of the plurality of unit conversion units electrically coupled to the output node may drive a control node to a voltage level corresponding to a voltage level of the reference voltage and electrically couples the control node to the output node. Further, each one of the plurality of unit conversion units that are not electrically coupled to the output node may substantially maintain a voltage level of the control node to a voltage level greater than a voltage level of a ground voltage.

In another embodiment of the invention, a digital to analog converter includes first to third unit conversion units that may be activated or deactivated in response to digital codes. An activated unit conversion unit may be electrically coupled to an output node and drive a control node to a voltage level corresponding to a voltage level of a reference voltage. Further, a deactivated unit conversion unit may substantially maintain the control node to a voltage level greater than a ground voltage. In addition, the deactivated unit conversion unit may substantially maintain the control node to a voltage level between a voltage level of the ground voltage and the voltage level of the control node.

DETAILED DESCRIPTION

Hereinafter, a digital to analog converter according to the invention will be described in detail with reference to the accompanying figures through an embodiment.

Figure 1:
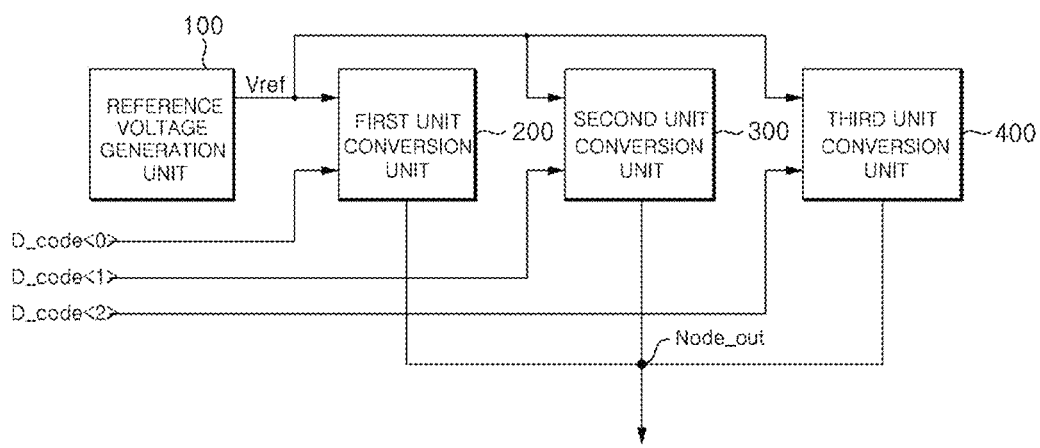
FIG. 1 is a configuration diagram of a digital to analog converter according to an embodiment.

Referring to FIG. 1, a digital to analog converter according to an embodiment includes a reference voltage generation unit 100 and first to third unit conversion units 200, 300, and 400.

The reference voltage generation unit 100 generates a reference voltage Vref.

In relation to the first to third unit conversion units 200, 300, and 400, the number of unit conversion units to be activated is decided according to digital codes D_code<0:2>. For example, among the first to third unit conversion units 200, 300, and 400, an activated unit conversion unit drives a control node Node_ctrl (illustrated in FIG. 2) to a voltage level corresponding to a voltage level of the reference voltage Vref. In addition, a deactivated unit conversion unit substantially maintains the control node Node_ctrl to a voltage level set to be higher than that of a ground voltage VSS (illustrated in FIG. 2). In this case, the deactivated unit conversion unit substantially maintains the control node Node_ctrl to a voltage level between the voltage level of the ground voltage VSS and the voltage level of the control node Node_ctrl of the activated unit conversion unit. Further, the deactivated unit conversion unit substantially maintains the control node to a voltage level that is configured to be greater than the voltage level of the ground voltage VSS. The activated unit conversion unit electrically couples its own control node Node_ctrl to an output node Node_out.

In relation to the first to third unit conversion units 200, 300, and 400, the number of unit conversion units to be electrically coupled to the output node Node_out is decided in response to the digital codes D_code<0:2>. For instance, among the first to third unit conversion units 200, 300, and 400, each unit conversion unit electrically coupled to the output node Node_out drives the control node Node_ctrl to the voltage level corresponding to the voltage level of the reference voltage Vref, and electrically couples the control node Node_ctrl to the output node Node_out. As such, the deactivated unit conversion unit commonly electrically couples the control node Node_ctrl to the output node Node_out. Among the first to third unit conversion units 200, 300, and 400, each unit conversion unit not electrically coupled to the output node Node_out substantially maintains the voltage level of the control node Node_ctrl to a voltage level higher than that of the ground voltage VSS. In this case, the voltage level of the control node Node_ctrl of the unit conversion unit not electrically coupled to the output node Node_out has a voltage level between the voltage level of the ground voltage VSS and the voltage level of the control node Node_ctrl of the unit conversion unit electrically coupled to the output node Node_out.

The first to third unit conversion units 200, 300, and 400 receive bits D_code<0>, D_code<1>, and D_code<2> of the digital codes D_code<0:2>, respectively. For example, the first unit conversion unit 200 receives the first bit D_code<0> of the digital codes D_code<0:2>. Further, the first unit conversion unit 200 is activated when the first bit D_code<0> has a specific level, that is, a high level. The second unit conversion unit 300 receives the second bit D_code<1> of the digital codes D_code<0:2>. In addition, the second unit conversion unit 300 is activated when the second bit D_code<1> has a specific level, that is, a high level. The third unit conversion unit 400 receives the third bit D_code<2> of the digital codes D_code<0:2>. The third unit conversion unit 400 is also activated when the third bit D_code<2> has a specific level, that is, a high level.

In an aspect, for example, the first unit conversion unit 200 electrically couples the control node Node_ctrl to the output node Node_out when the first bit D_code<0> of the digital codes D_code<0:2> has a specific level, that is, a high level. The second unit conversion unit 300 electrically couples its own control node to the output node Node_out when the second bit D_code<1> of the digital codes D_code<0:2> has a specific level, that is, a high level. The third unit conversion unit 400 electrically couples its own control node to the output node Node_out when the third bit D_code<2> of the digital codes D_code<0:2> has a specific level, that is, a high level.

The first to third unit conversion units 200, 300, and 400 may have substantially the same configuration except for differences in inputted signals and outputted signals. Therefore, only the configuration of the first unit conversion unit 200 will be described, and a description for the configurations of the other unit conversion units 300 and 400 will be omitted in order to avoid redundancy.

Figure 2:
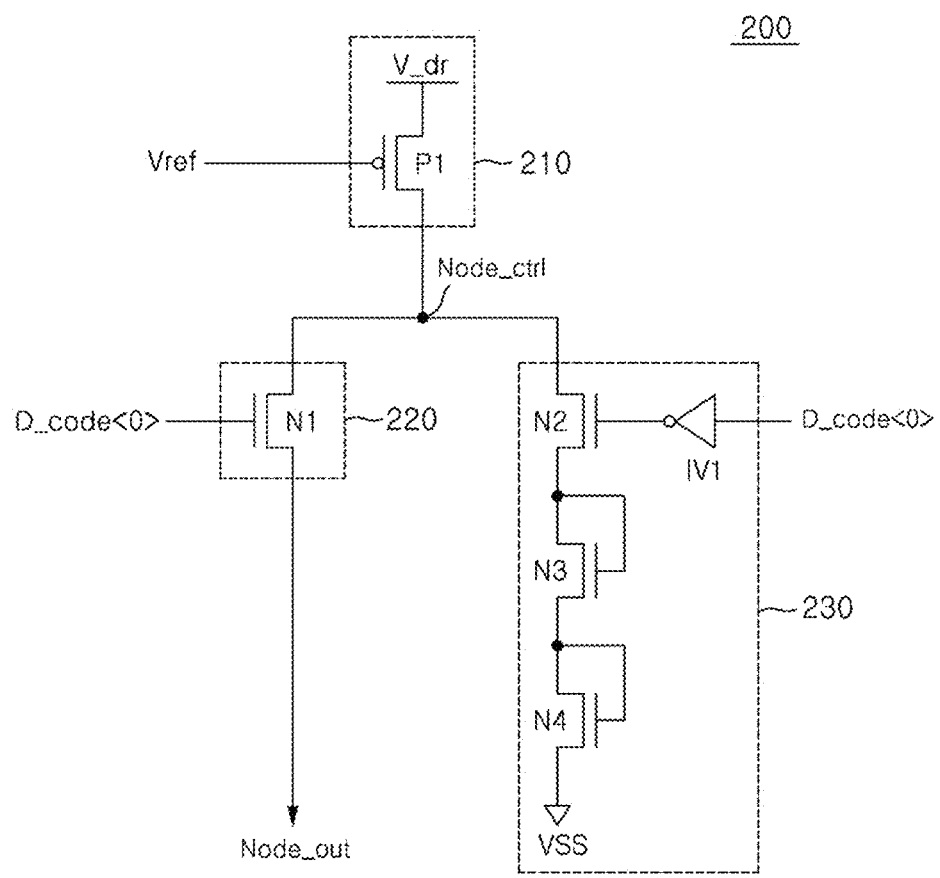
FIG. 2 is a configuration diagram of a first unit conversion unit of FIG. 1.

Referring to FIG. 2, the first unit conversion unit 200 includes a voltage applying section 210, an output control section 220, and a voltage control section 230.

The voltage applying section 210 drives the control node Node_ctrl in response to the voltage level of the reference voltage Vref. For example, as the voltage level of the reference voltage Vref becomes low, the voltage applying section 210 provides a large amount of voltage or current to the control node Node_ctrl.

The voltage applying section 210 includes a first transistor P1. The first transistor P1 receives the reference voltage Vref through a gate thereof. The first transistor P1 also receives a driving voltage V_dr through a source thereof, and has a drain electrically coupled to the control node Node_ctrl.

The output control section 220 electrically couples or separates the control node Node_ctrl to/from the output node Node_out in response to the first bit D_code<0> of the digital codes D_code<0:2>. For example, when the first bit D_code<0> of the digital codes D_code<0:2> has a specific level, that is, a high level, the output control section 220 electrically couples the control node Node_ctrl to the output node Node_out. In addition, when the first bit D_code<0> has a low level, the output control section 220 separates the control node Node_ctrl from the output node Node_out.

The output control section 220 includes a second transistor N1. The second transistor N1 receives the first bit D_code<0> of the digital codes D_code<0:2> through a gate thereof. The second transistor N1 also has a drain and a source electrically coupled to the control node Node_ctrl and the output node Node_out, respectively.

The voltage control section 230 controls the voltage level of the control node Node_ctrl in response to the first bit D_code<0> of the digital codes D_code<0:2>. For example, when the first bit D_code<0> of the digital codes D_code<0:2> does not have the specific level, the voltage control section 230 reduces the voltage level of the control node Node_ctrl. Further, when the first bit D_code<0> of the digital codes D_code<0:2> has the specific level, the voltage control section 230 does not perform the operation for reducing the voltage level of the control node Node_ctrl.

The voltage control section 230 includes third to fifth transistors N2 to N4 and an inverter IV1. The inverter IV1 receives the first bit D_code<0> of the digital codes D_code<0:2>. The third transistor N2 receives an output signal of the inverter IV1 through a gate thereof, and has a drain electrically coupled to the control node Node_ctrl. The fourth transistor N3 has a gate and a drain commonly electrically coupled to a source of the third transistor N2. The fifth transistor N4 has a gate and a drain commonly electrically coupled to a source of the fourth transistor N3, and receives the ground voltage VSS through a source thereof.

The operation of the digital to analog converter configured above according to the embodiment will be described as follows.

With reference to FIG. 2, the operation of the first unit conversion unit 200 will be described.

The voltage applying section 210 provides a predetermined amount of current to the control node Node_ctrl according to the voltage level of the reference voltage Vref. Alternatively, the voltage applying section 210 provides a voltage having a predetermined s voltage level to the control node Node_ctrl.

The output control section 220 electrically couples the control node Node_ctrl to the output node Node_out when the first bit D_code<0> of the digital codes D_code<0:2> has a high level, thereby transferring a current or a voltage provided to the control node Node_ctrl to the output node Node_out. However, when the first bit D_code<0> of the digital codes D_code<0:2> has a low level, the output control section 220 separates the control node Node_ctrl from the output node Node_out, thereby substantially preventing a current or a voltage from being transferred to the output node Node_out from the control node Node_ctrl.

The voltage control section 230 reduces the voltage level of the control node Node_ctrl when the first bit D_code<0> of the digital codes D_code<0:2> has a low level. For example, when the first bit D_code<0> of the digital codes D_code<0:2> has the low level, the voltage control section 230 substantially maintains the control node Node_ctrl to a voltage level lower than the voltage level of the control node Node_ctrl when the first bit D_code<0> has a high level and higher than that of the ground voltage VSS. More specifically, when the first bit D_code<0> of the digital codes D_code<0:2> has the low level, the third transistor N2 of the voltage control section 230 is turned on so that the control node Node_ctrl is electrically coupled to the fourth transistor N3. In this case, voltage drop occurs in the control node Node_ctrl by a resistance component of the fourth transistor N3 and the fifth transistor N4 serially electrically coupled to each other between the ground voltage terminal VSS and the control node Node_ctrl. Accordingly, when the first bit D_code<0> of the digital codes D_code<0:2> has the low level, the voltage control section 230 substantially maintains the control node Node_ctrl to the voltage level lower than the voltage level of the control node Node_ctrl when the first bit D_code<0> has the high level and higher than that of the ground voltage VSS. Furthermore, when the first bit D_code<0> of the digital codes D_code<0:2> has the high level, the third transistor N2 of the voltage control section 230 is turned off, so that the control node Node_ctrl is separated from the fourth transistor N3 and the voltage level of the control node Node_ctrl is not reduced.

When the first bit D_code<0> of the digital codes D_code<0:2> has the low level, if the voltage control section 230 reduces the control node Node_ctrl to the voltage level of the ground voltage VSS, a voltage variation range of the control node Node_ctrl increases. The voltage change in the control node Node_ctrl is a coupling phenomenon. In addition, the voltage level of the control node Node_ctrl is changed up to the voltage level of the reference voltage Vref. The voltage level of the reference voltage Vref is changed, resulting in a change in a voltage or a current applied to the control node Node_ctrl from the voltage applying section 210. In this regard, the unit conversion units of the digital to analog converter according to an embodiment reduce such a voltage variation range of the control node, thereby substantially preventing an abnormal operation of the digital to analog converter.

As described above, the operation of the first unit conversion unit 200 is substantially the same as those of the other unit conversion units 300 and 400.

The second unit conversion unit 300 outputs a current or a voltage corresponding to the voltage level of the reference voltage Vref to the output node Node_out when the second bit D_code<1> of the digital codes D_code<0:2> has a high level.

The third unit conversion unit 400 outputs a current or a voltage corresponding to the voltage level of the reference voltage Vref to the output node Node_out when the third bit D_code<2> of the digital codes D_code<0:2> has a high level.

The second and third unit conversion units 300 and 400 do not also reduce the voltage levels of their own control nodes up to the voltage level of the ground voltage VSS when the second bit D_code<1> and the third bit D_code<2> of the digital codes D_code<0:2> have a low level. Accordingly, the second and third unit conversion units 300 and 400 are thereby reducing a change in the voltage level of the reference voltage Vref and substantially preventing an abnormal operation of the digital to analog converter.

Since all the first to third unit conversion units 200, 300, and 400 are commonly electrically coupled to the output node Node_out, when the first to third unit conversion units 200, 300, and 400 are activated, currents or voltages output from the first to third unit conversion units 200, 300, and 400 are summed in the output node Node_out. Consequently, the digital to analog converter according to an embodiment can generate an analog signal in which a current or a voltage is changed according to the digital codes D_code<0:2>.

Figure 3:
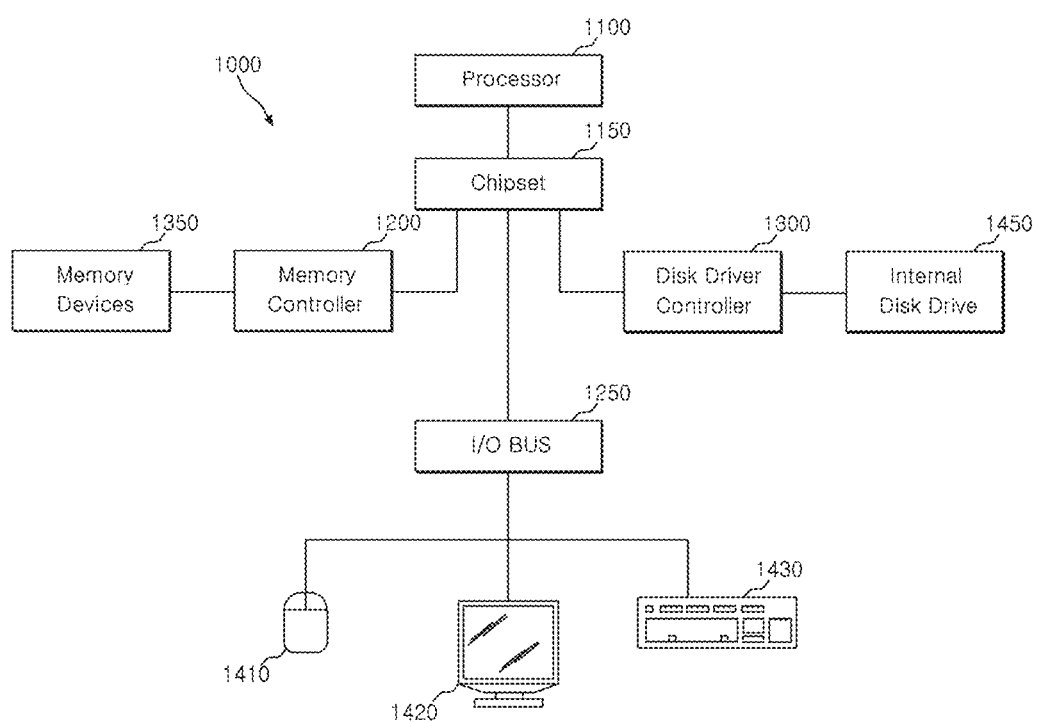
FIG. 3 illustrates a block diagram of a system employing a memory controller circuit in accordance with an embodiment of the invention.

Referring to FIG. 3, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 100. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the digital to analog converter described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While certain embodiments have been described above, it will be understood to those skilled in the art that the embodiments described are by way of example only. Accordingly, the digital to analog converter described should not be limited based on the described embodiments. Rather, the digital to analog converter described should only be limited in light of the claims that follow when taken in conjunction with the above description and accompanying figures.

What is claimed is:

1. A digital to analog converter comprising:
a reference voltage generation unit that generates a reference voltage; and
a plurality of unit conversion units, and a number of unit conversion units to be activated being decided in response to digital codes,
wherein the unit conversion units are deactivated or activated in response to digital codes, each activated unit conversion unit drives a control node to a voltage level corresponding to a voltage level of the reference voltage, and each deactivated unit conversion unit substantially maintains the control node to a voltage level greater than a voltage level of a ground voltage.

2. The digital to analog converter according to claim 1, wherein the deactivated unit conversion unit is configured to substantially maintain the control node to the set voltage level between a voltage level of the control node of the activated unit conversion unit and the voltage level of the ground voltage.

3. The digital to analog converter according to claim 1, wherein the deactivated unit conversion unit commonly electrically couples the control node and an output node.

4. The digital to analog converter according to claim 1, wherein each of the plurality of unit conversion units receives each bit of the digital codes and is activated when one of the bits has a specific level.

5. The digital to analog converter according to claim 4, wherein each of the plurality of unit conversion units comprises:
a voltage applying section that drives the control node in response to the voltage level of the reference voltage;
an output control section that electrically couples or separates the control node to/from the output node in response to the one of the bits; and
a voltage control section that controls the voltage level of the control node in response to the one of the bits.

6. The digital to analog converter according to claim 5, wherein the output control section electrically couples the control node to the output node when the one of the bits has the specific level, and separates the control node from the output node when the one of the bits is not at the specific level.

7. The digital to analog converter according to claim 6, wherein the voltage control section reduces the voltage level of the control node when the one of the bits does not have the specific level, and does not perform an operation for reducing the voltage level of the control node when the one of the bits has the specific level.

8. A digital to analog converter comprising:
a plurality of unit conversion units,
wherein a number of unit conversion units to be electrically coupled to an output node is decided in response to digital codes, and each of unit conversion units electrically coupled to the output node drives a control node to a voltage level corresponding to a voltage level of the reference voltage and electrically couples the control node to the output node, and each of unit conversion units not electrically coupled to the output node substantially maintains a voltage level of the control node to a voltage level greater than a voltage level of a ground voltage.

9. The digital to analog converter according to claim 8, wherein a voltage level of the control node of the unit conversion unit not electrically coupled to the output node is a voltage level between the voltage level of the ground voltage and a voltage level of the control node of the unit conversion unit electrically coupled to the output node.

10. The digital to analog converter according to claim 9, wherein each of the plurality of unit conversion units receives a bit of the digital codes and is electrically coupled to the output node when the bit for each of the plurality of unit conversion units has a specific level.

11. The digital to analog converter according to claim 10, wherein each of the plurality of unit conversion units comprises:
a voltage applying section that drives the control node in response to the voltage level of the reference voltage;
an output control section that electrically couples or separates the control node to/from the output node in response to the bit; and
a voltage control section that controls the voltage level of the control node in response to the bit.

12. A digital to analog converter comprising:
first to third unit conversion units configured to be activated or deactivated in response to digital codes;
an activated unit conversion unit electrically coupled to an output node and configured to drive a control node to a voltage level corresponding to a voltage level of a reference voltage; and
a deactivated unit conversion unit configured to substantially maintain the control node to a voltage level greater than a ground voltage,
wherein the deactivated unit conversion unit is configured to substantially maintain the control node to a voltage level between a voltage level of the ground voltage and the voltage level of the control node.

13. The digital to analog converter according to claim 12, further comprising:
a voltage control section configured to reduce the voltage level of the control node in response to one bit of digital codes.

14. The digital to analog converter according to claim 13, further comprising:
an output control section configured to separate the control node from the output node in response to the one bit of the digital codes.

15. The digital to analog converter according to claim 13, wherein the voltage control section is configured to reduce the voltage level of the control node when the one bit of the digital codes is at a specific level.

16. The digital to analog converter according to claim 13, wherein the voltage control section is configured to substantially maintain the control node to a voltage less than the voltage level of the control node when the one bit of the digital codes is at a high level.

17. The digital to analog converter according to claim 13, wherein the output control section electrically couples the control node to the output node in response to the one bit of the digital codes.

18. The digital to analog converter according to claim 12, wherein the second and third unit conversion units are configured to not reduce internal voltage levels to the voltage level of the ground voltage.

19. The digital to analog converter according to claim 12, wherein the first to third unit conversion units are electrically coupled to the output node.

20. The digital to analog converter according to claim 12, further comprising:
a voltage control section configured to not reduce the voltage level of the control node according to one bit of digital codes.

* * * * *